United States Patent
Shridharan et al.

(10) Patent No.: US 11,973,032 B2
(45) Date of Patent: *Apr. 30, 2024

(54) INTERNAL NODE JUMPER FOR MEMORY BIT CELLS

(71) Applicant: Intel Corporation, Santa Clara, CA (US)

(72) Inventors: Smita Shridharan, Beaverton, OR (US); Zheng Guo, Portland, OR (US); Eric A. Karl, Portland, OR (US); George Shchupak, Zviya (IL); Tali Kosinovsky, Haifa (IL)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/119,225

(22) Filed: Mar. 8, 2023

(65) Prior Publication Data

US 2023/0223339 A1 Jul. 13, 2023

Related U.S. Application Data

(63) Continuation of application No. 17/524,665, filed on Nov. 11, 2021, now Pat. No. 11,640,939, which is a
(Continued)

(51) Int. Cl.
*H01L 23/528* (2006.01)
*H01L 23/535* (2006.01)
(Continued)

(52) U.S. Cl.
CPC .......... *H01L 23/528* (2013.01); *H01L 23/535* (2013.01); *H01L 27/0924* (2013.01); *H10B 10/12* (2023.02)

(58) Field of Classification Search
CPC . H01L 23/528; H01L 23/535; H01L 27/0924; H01L 27/1104; H01L 27/0611;
(Continued)

(56) References Cited

U.S. PATENT DOCUMENTS 6,294,806 B1 9/2001 Kim
7,236,396 B2 6/2007 Houston
(Continued)

FOREIGN PATENT DOCUMENTS

EP 088785781 10/2006
JP 2006339480 A 12/2006
(Continued)

OTHER PUBLICATIONS

Office Action for Korean Patent Application No. 10-2019-7034274 dated May 30, 2023, 4 pgs.
(Continued)

*Primary Examiner* — Jonathan Han
(74) *Attorney, Agent, or Firm* — Schwabe Williamson & Wyatt, P.C.

(57) ABSTRACT

Memory bit cells having internal node jumpers are described. In an example, an integrated circuit structure includes a memory bit cell on a substrate. The memory bit cell includes first and second gate lines parallel along a second direction of the substrate. The first and second gate lines have a first pitch along a first direction of the substrate, the first direction perpendicular to the second direction. First, second and third interconnect lines are over the first and second gate lines. The first, second and third interconnect lines are parallel along the second direction of the substrate. The first, second and third interconnect lines have a second pitch along the first direction, where the second
(Continued)

pitch is less than the first pitch. One of the first, second and third interconnect lines is an internal node jumper for the memory bit cell.

20 Claims, 7 Drawing Sheets

Related U.S. Application Data continuation of application No. 16/604,807, filed as application No. PCT/US2017/038389 on Jun. 20, 2017, now Pat. No. 11,205,616.

(51) Int. Cl.
*H01L 27/092* (2006.01)
*H10B 10/00* (2023.01)

(58) Field of Classification Search
CPC ..... H01L 27/11; H01L 29/0692; H10B 10/12; H10B 10/00
See application file for complete search history.

(56) References Cited

U.S. PATENT DOCUMENTS

| | | | |
|---|---|---|---|
| 8,159,265 | B1 | 4/2012 | Madurawe |
| 9,331,016 | B2 | 5/2016 | Chen et al. |
| 9,437,588 | B1 | 9/2016 | Zeng |
| 9,659,635 | B1 | 5/2017 | Liaw |
| 11,640,939 | B2 * | 5/2023 | Shridharan ......... H01L 27/0924 257/369 |
| 2007/0002617 | A1 | 1/2007 | Houston et al. |
| 2008/0251878 | A1 | 10/2008 | Mandelman et al. |
| 2009/0271753 | A1 | 10/2009 | Quandt et al. |
| 2014/0153321 | A1* | 6/2014 | Liaw ..................... G11C 11/413 365/154 |
| 2016/0314831 | A1 | 10/2016 | Liaw |
| 2016/0372476 | A1 | 12/2016 | Hung |
| 2017/0154671 | A1 | 6/2017 | Liaw |
| 2018/0005691 | A1 | 1/2018 | Liaw |
| 2018/0182766 | A1 | 6/2018 | Huang |

FOREIGN PATENT DOCUMENTS

| | | |
|---|---|---|
| JP | 2010109232 A | 5/2010 |
| KR | 10-2016-0034338 | 3/2016 |
| WO | WO 2016/117288 | 7/2016 |

OTHER PUBLICATIONS

International Search Report and Written Opinion for International Patent Application No. PCT/US2017/038389 dated Feb. 14, 2018, 11 pgs.
International Preliminary Report on Patentability for International Patent Application No. PCT/US2017/038389, dated Jan. 2, 2020, 8 Pgs.
Search Report from European Patent Application No. 17915137.8, dated Apr. 26, 2021, 9 Pgs.
Office Action for Korean Patent Application No. 10-2019-7034274 dated Jun. 30, 2022, 9 pgs., with English summary.
Office Action for Korean Patent Application No. 10-2019-7034274 dated Jan. 11, 2023, 4 pgs., with English summary.
Office Action for Chinese Patent Application No. 201780091023.X mailed Nov. 2, 2023, 30 pgs.

* cited by examiner

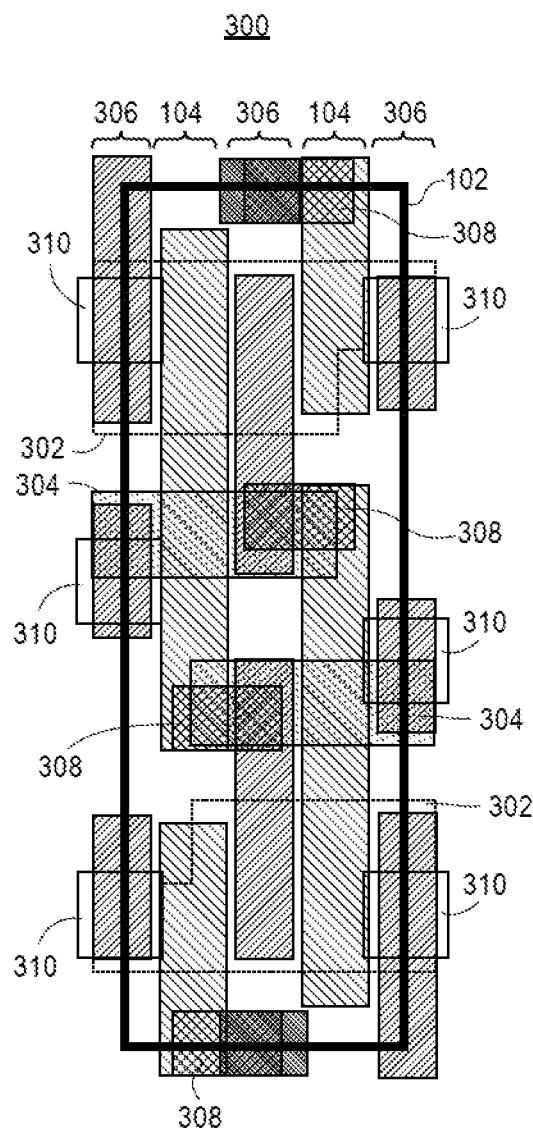
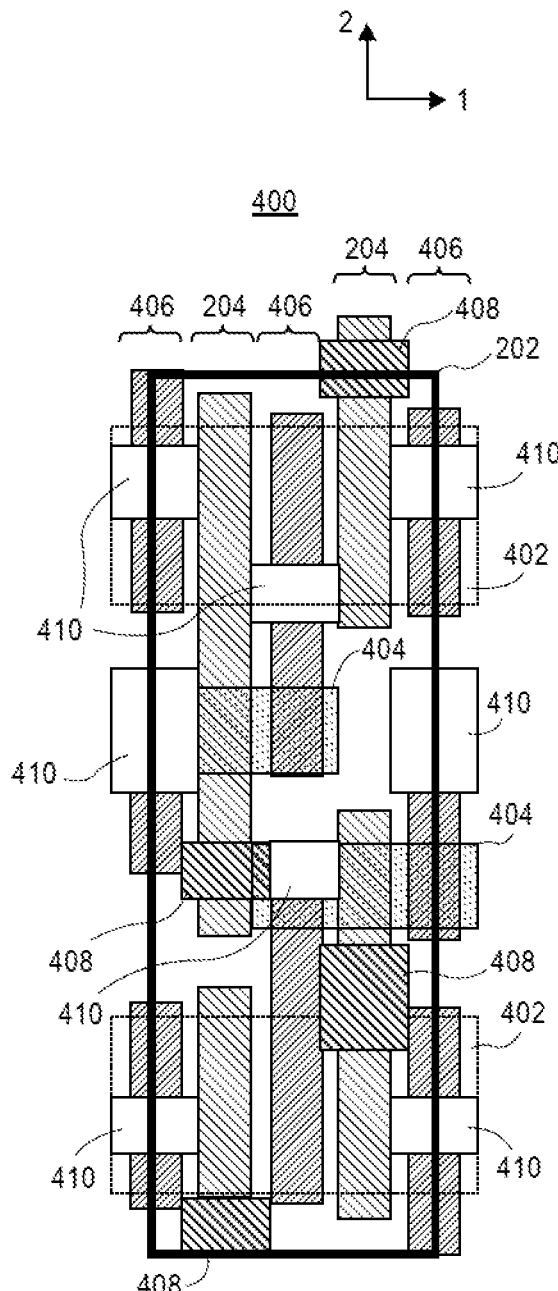
FIG. 3
FIG. 4

INTERNAL NODE JUMPER FOR MEMORY BIT CELLS

CROSS-REFERENCE TO RELATED APPLICATION

This patent application is a continuation of U.S. patent application Ser. No. 17/524,665, filed Nov. 11, 2021, which is a continuation of U.S. patent application Ser. No. 16/604,807, filed Oct. 11, 2019, now U.S. Pat. No. 11,205,616, issued Dec. 21, 2021, which is a U.S. National Phase Application under 35 U.S.C. § 371 of International Application No. PCT/US2017/038389, filed Jun. 20, 2017, entitled "INTERNAL NODE JUMPER FOR MEMORY BIT CELLS," which designates the United States of America, the entire disclosure of which are hereby incorporated by reference in their entirety and for all purposes.

TECHNICAL FIELD

Embodiments of the disclosure are in the field of integrated circuit structures and, in particular, memory bit cells having internal node jumpers.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips.

For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant. In the manufacture of integrated circuit devices, multi-gate transistors, such as tri-gate transistors, have become more prevalent as device dimensions continue to scale down. In conventional processes, tri-gate transistors are generally fabricated on either bulk silicon substrates or silicon-on-insulator substrates. In some instances, bulk silicon substrates are preferred due to their lower cost and compatibility with the existing high-yielding bulk silicon substrate infrastructure. Scaling multi-gate transistors has not been without consequence, however. As the dimensions of these fundamental building blocks of microelectronic circuitry are reduced and as the sheer number of fundamental building blocks fabricated in a given region is increased, the constraints on the semiconductor processes used to fabricate these building blocks have become overwhelming.

Variability in conventional and state-of-the-art fabrication processes may limit the possibility to further extend them into the, e.g. 10 nm or sub-10 nm range. Consequently, fabrication of the functional components needed for future technology nodes may require the introduction of new methodologies or the integration of new technologies in current fabrication processes or in place of current fabrication processes. New layouts may be introduced either to accommodate or to enable such future technology nodes.

BRIEF DESCRIPTION OF THE DRAWINGS

FIG. 3 illustrates a second view of a conventional cell layout for a memory cell.

FIG. 4 illustrates a second view of a cell layout for a memory cell having an internal node jumper, in accordance with an embodiment of the present disclosure.

DESCRIPTION OF THE EMBODIMENTS

Figure 1:
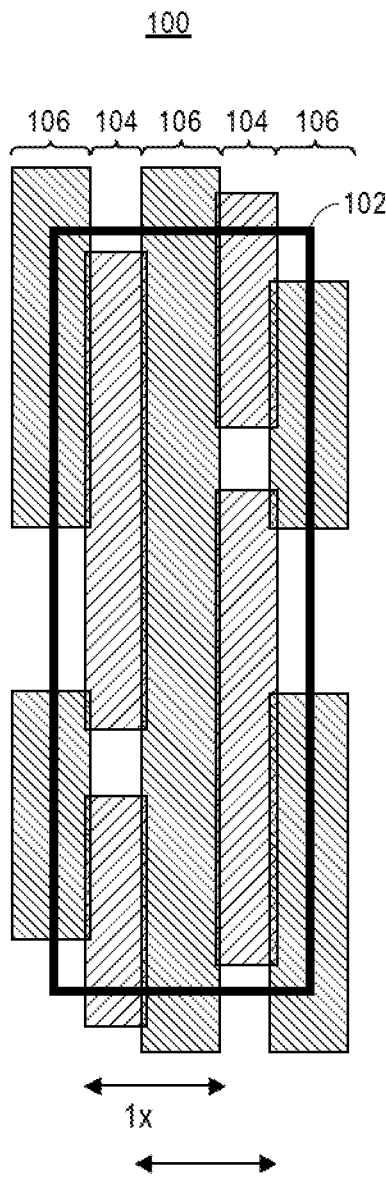
FIG. 1 illustrates a first view of a conventional cell layout for a memory cell.

Memory bit cells having internal node jumpers are described. In the following description, numerous specific details are set forth, such as specific layout and material regimes, in order to provide a thorough understanding of embodiments of the present disclosure. It will be apparent to one skilled in the art that embodiments of the present disclosure may be practiced without these specific details. In other instances, well-known features, such as single or dual damascene processing, are not described in detail in order to not unnecessarily obscure embodiments of the present disclosure. Furthermore, it is to be understood that the various embodiments shown in the Figures are illustrative representations and are not necessarily drawn to scale. In some cases, various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back end of line (BEOL) semiconductor processing and structures. BEOL is the second portion of IC fabrication where the individual devices (e.g., transistors, capacitors, resistors, etc.) are interconnected with wiring on the wafer, e.g., the metalization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

One or more embodiments described herein are directed to memory bit cells having an internal node jumper. Particular embodiments may include a layout-efficient technique of implementing memory bit cells in advanced self-aligned process technologies. Embodiments may be directed to 10 nanometer or smaller technology nodes. Embodiments may provide an ability to develop memory bit cells having improved performance within a same footprint by utilizing contact over active gate (COAG) and/or aggressive metal 1 (M1) pitch scaling. Embodiments may include or be directed to bit cell layouts that make possible higher performance bit cells in a same or smaller footprint relative to a previous technology node.

In accordance with an embodiment of the present disclosure, a higher metal layer (e.g., metal 1 or M1) jumper is implemented to connect internal nodes rather than the use of a traditional gate-trench contact-gate contact (poly-tcn-poly-con) connection. In an embodiment, a contact over active gate (COAG) integration scheme combined with a metal 1 jumper to connect internal nodes mitigates or altogether eliminates the need to grow a footprint for a higher performance bit cell. That is, an improved transistor ratio may be achieved. In an embodiment, such an approach enables aggressive scaling to provide improved cost per transistor for, e.g., a 10 nanometer (10 nm) technology node. Internal node M1 jumpers may be implemented in SRAM, RF and Dual Port bit cells in 10 nm technology to produce very compact layouts.

As a comparative example, FIG. 1 illustrates a first view of a conventional cell layout for a memory cell.

Referring to FIG. 1, an exemplary 14 nanometer (14 nm) layout 100 includes a bit cell 102. Bit cell 102 includes gate or poly lines 104 and metal 1 (M1) lines 106. In the example shown, the poly lines 104 have a 1× pitch, and the M1 lines 106 have a 1× pitch. In a particular embodiment, the poly lines 104 have 70 nm pitch, and the M1 lines 106 have a 70 nm pitch.

Figure 2:
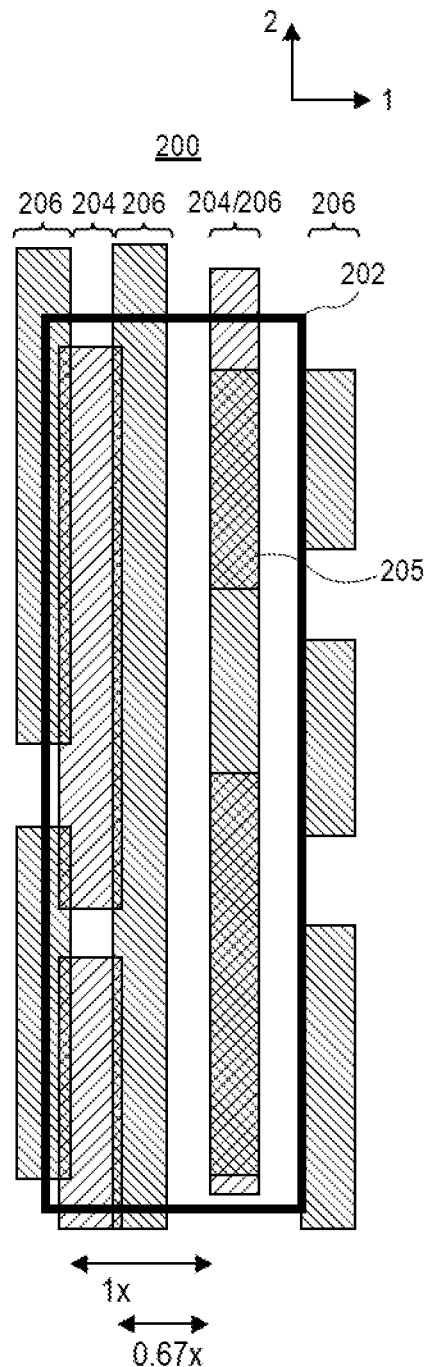
FIG. 2 illustrates a first view of a cell layout for a memory cell having an internal node jumper, in accordance with an embodiment of the present disclosure.

In contrast to FIG. 1, FIG. 2 illustrates a first view of a cell layout for a memory cell having an internal node jumper, in accordance with an embodiment of the present disclosure.

Referring to FIG. 2, an exemplary 10 nanometer (10 nm) layout 200 includes a bit cell 202. Bit cell 202 includes gate or poly lines 204 and metal 1 (M1) lines 206. In the example shown, the poly lines 204 have 1× pitch, and the M1 lines 206 have a 0.67× pitch. The result is an overlapping line 205, which includes a M1 line directly over a poly line. In a particular embodiment, the poly lines 204 have 54 nm pitch, and the M1 lines 206 have a 36 nm pitch.

In comparison to layout 100, in layout 200, the M1 pitch is less than the gate pitch, freeing up an extra line (205) every third line (e.g., for every two poly lines, there are three M1 lines). The "freed up" M1 line is referred to herein as an internal node jumper. The internal node jumper may be used for gate to gate (poly to poly) interconnection or for trench contact to trench contact interconnection. In an embodiment, contact to poly is achieved through a contact over active gate (COAG) arrangement, enabling fabrication of the internal node jumper.

Referring more generally to FIG. 2, in an embodiment, an integrated circuit structure includes a memory bit cell 202 on a substrate. The memory bit cell 202 includes first and second gate lines 204 parallel along a second direction 2 of the substrate. The first and second gate lines 202 have a first pitch along a first direction (1) of the substrate, the first direction (1) perpendicular to the second direction (2). First, second and third interconnect lines 206 are over the first and second gate lines 204. The first, second and third interconnect lines 206 are parallel along the second direction (2) of the substrate. The first, second and third interconnect lines 206 have a second pitch along the first direction, where the second pitch is less than the first pitch. In one embodiment, one of the first, second and third interconnect lines 206 is an internal node jumper for the memory bit cell 202.

As is applicable throughout the present disclosure, the gate lines 204 may be referred to as being on tracks to form a grating structure. The interconnect lines 206 may also be referred to as being on tracks to form a grating structure. In an embodiment, the term "grating" for gate lines or interconnect lines is used herein to refer to a tight pitch grating structure. In one such embodiment, the tight pitch is not achievable directly through conventional lithography. For example, a pattern based on conventional lithography may first be formed, but the pitch may be halved by the use of spacer mask patterning, as is known in the art. Even further, the original pitch may be quartered by a second round of spacer mask patterning. Accordingly, the grating-like patterns described herein may have gate lines or interconnect lines spaced at a constant pitch and having a constant width. The pattern may be fabricated by a pitch halving or pitch quartering, or other pitch division, approach.

As a comparative example, FIG. 3 illustrates a second view of a conventional cell layout 300 for a memory cell.

Referring to FIG. 3, the 14 nm bit cell 102 is shown with N-diffusion 302 (e.g., P-type doped active regions, such as boron doped diffusion regions of an underlying substrate) and P-diffusion 304 (e.g., N-type doped active regions, such as phosphorous and/or arsenic doped diffusion regions of an underlying substrate) with M1 lines removed for clarity. Layout 300 of bit cell 102 includes gate or poly lines 104, trench contacts 306, gate contacts 308 (specific for 14 nm node) and contact vias 310.

In contrast to FIG. 3, FIG. 4 illustrates a second view of a cell layout 400 for a memory cell having an internal node jumper, in accordance with an embodiment of the present disclosure.

Referring to FIG. 4, the 10 nm bit cell 202 is shown with N-diffusion 402 (e.g., P-type doped active regions, such as boron doped diffusion regions of an underlying substrate) and P-diffusion 404 (e.g., N-type doped active regions, such as phosphorous and/or arsenic doped diffusion regions of an underlying substrate) with M1 lines removed for clarity. Layout 400 of bit cell 202 includes gate or poly lines 204, trench contacts 406, gate vias 408 (specific for 10 nm node) and trench contact vias 310.

In comparing layouts 300 and 400, in accordance with an embodiment of the present disclosure, in the 14 nm layout the internal nodes are connected by a gate contact (GCN) only. An enhanced performance layout cannot be created in the same footprint due to poly to GCN space constraints. In the 10 nm layout, the design allows for landing a contact (VCG) on the gate to eliminate the need for a poly contact. In one embodiment, the arrangement enabled connection of an internal node using M1, allowing for addition active region density (e.g., increased number of fins) within the 14 nm footprint. In the 10 nm layout, upon using a COAG architecture, spacing between diffusion regions can be made smaller since they are not limited by trench contact to gate contact spacing. In an embodiment, the layout 300 of FIG. 3 is referred to as a 112 (1 fin pull-up, 1 fin pass gate, 2 fin pull down) arrangement. By contrast, the layout 400 of FIG. 4 is referred to as a 122 (1 fin pull-up, 2 fin pass gate, 2 fin pull down) arrangement that, in a particular embodiment, is within the same footprint as the 112 layout of FIG. 3. In an embodiment, the 122 arrangement provides improved performance as compared with the 112 arrangement.

Figure 5:
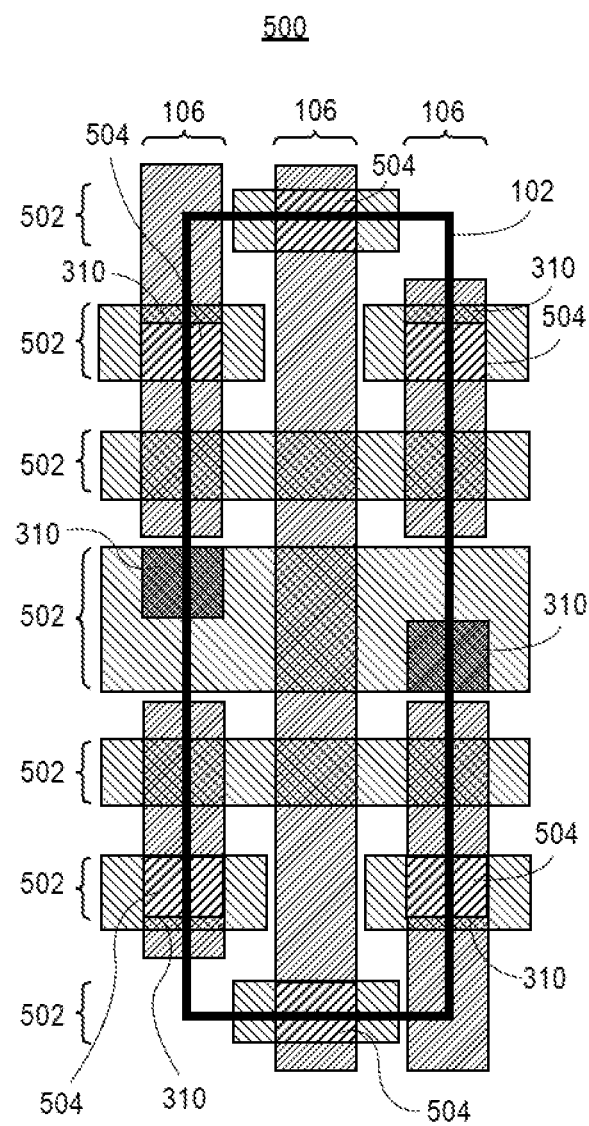
FIG. 5 illustrates a third view of a conventional cell layout for a memory cell.

As a comparative example, FIG. 5 illustrates a third view of a conventional cell layout 500 for a memory cell.

Referring to FIG. 5, the 14 nm bit cell 102 is shown with metal 0 (M0) lines 502 with poly lines removed for clarity. Also shown are metal 1 (M1) lines 106, contact vias 310, via 0 structures 504.

Figure 6:
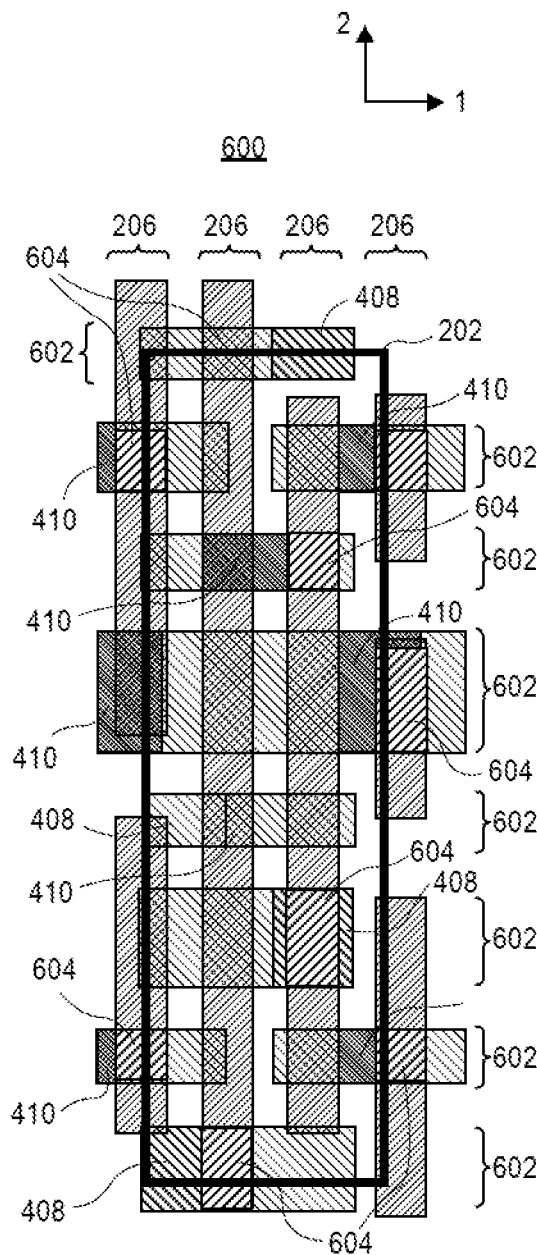
FIG. 6 illustrates a third view of a cell layout for a memory cell having an internal node jumper, in accordance with an embodiment of the present disclosure.

In contrast to FIG. 5, FIG. 6 illustrates a third view of a cell layout for a memory cell having an internal node jumper, in accordance with an embodiment of the present disclosure.

Referring to FIG. 6, the 10 nm bit cell 202 is shown with metal 0 (M0) lines 602 with poly lines removed for clarity. Also shown are metal 1 (M1) lines 206, gate vias 408, trench contact vias 410, and via 0 structures 604. In comparing FIGS. 5 and 6, in accordance with an embodiment of the present invention, for the 14 nm layout the internal nodes are connected by gate contact (GCN) only, while for the 10 nm layout one of the internal nodes is connected using a M1 jumper.

Referring to FIGS. 2, 4 and 6 collectively, in accordance with an embodiment of the present disclosure, an integrated circuit structure includes a memory bit cell 202 on a substrate. The memory bit cell 202 includes first (top 402), second (top 404), third (bottom 404) and fourth (bottom 402) active regions parallel along a first direction (1) of the substrate. First (left 204) and second (right 204) gate lines are over the first, second, third and fourth active regions 402/404. The first and second gate lines 204 are parallel along a second direction (2) of the substrate, the second direction (2) perpendicular to the first direction (1). First (far left 206), second (near left 206) and third (near right 206) interconnect lines are over the first and second gate lines 204. The first, second and third interconnect lines 206 are parallel along the second direction (2) of the substrate.

In an embodiment, the first (far left 206) and second (near left 206) interconnect lines are electrically connected to the first and second gate lines 204 at locations of the first and second gate lines 204 over one or more of the first, second, third and fourth active regions 402/404 (e.g., at so-called "active gate" locations). In one embodiment, the first (far left 206) and second (near left 206) interconnect lines are electrically connected to the first and second gate lines 204 by an intervening plurality of interconnect lines 604 vertically between the first and second interconnect lines 206 and the first and second gate lines 204. The intervening plurality of interconnect lines 604 is parallel along the first direction (1) of the substrate.

In an embodiment, the third interconnect line (near right 206) electrically couples together a pair of gate electrodes of the memory bit cell 202, the pair of gate electrodes included in the first and second gate lines 204. In another embodiment, the third interconnect line (near right 206) electrically couples together a pair of trench contacts of the memory bit cell 202, the pair of trench contacts included in a plurality of trench contact lines 406. In an embodiment, the third interconnect line (near right 206) is an internal node jumper.

In an embodiment, the first active region (top 402) is a P-type doped active region (e.g., to provide N-diffusion for an NMOS device), the second active region (top 404) is an N-type doped active region (e.g., to provide P-diffusion for a PMOS device), the third active region (bottom 404) is an N-type doped active region (e.g., to provide P-diffusion for a PMOS device), and the fourth active region (bottom 402) is an N-type doped active region (e.g., to provide N-diffusion for an NMOS device). In an embodiment, the first, second, third and fourth active regions 402/404 are in silicon fins. In an embodiment, the memory bit cell 202 includes a pull-up transistor based on a single silicon fin, a pass-gate transistor based on two silicon fins, and a pull-down transistor based on two silicon fins.

In an embodiment, the first and second gate lines 204 alternate with individual ones of a plurality of trench contact lines 406 parallel along the second direction (2) of the substrate. The plurality of trench contact lines 406 includes trench contacts of the memory bit cell 202. The first and second gate lines 204 include gate electrode of the memory bit cell 202.

In an embodiment, the first and second gate lines 204 have a first pitch along the first direction (1). The first, second and third interconnect lines 206 have a second pitch along the first direction (2). In one such embodiment, the second pitch is less than the first pitch. In a specific such embodiment, the first pitch is in the range of 50 nanometers to 60 nanometers, and the second pitch is in the range of 30 nanometers to 40 nanometers. In a particular such embodiment, the first pitch is 54 nanometers, and the second pitch is 36 nanometers.

Embodiments described herein may be implemented to provide an increased number of fins within a relatively same bit cell footprint as a previous technology node, enhancing the performance of a smaller technology node memory bit cell relative to that of a previous generation. As an example, FIGS. 7A and 7B illustrate a bit cell layout and a schematic diagram, respectively, for a six transistor (6T) static random access memory (SRAM), in accordance with an embodiment of the present disclosure.

Figure 7A:
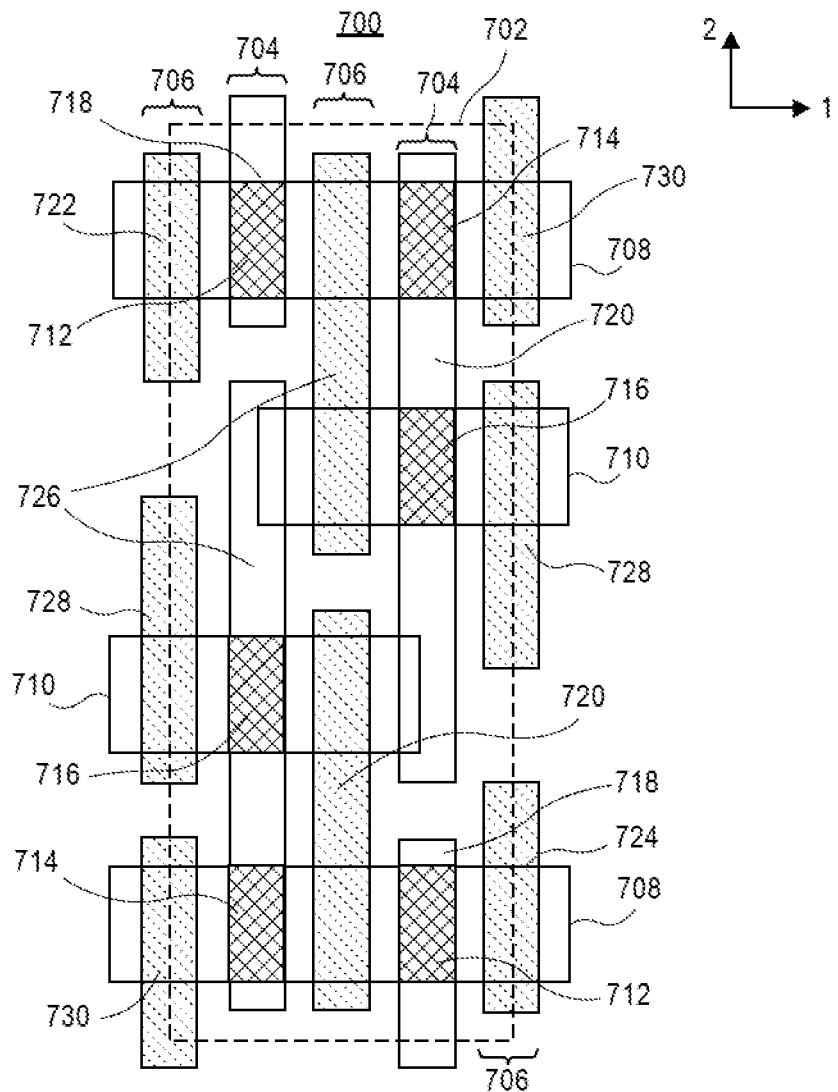
FIGS. 7A and 7B illustrate a bit cell layout and a schematic diagram, respectively, for a six transistor (6T) static random access memory (SRAM), in accordance with an embodiment of the present disclosure.
Figure 7B:
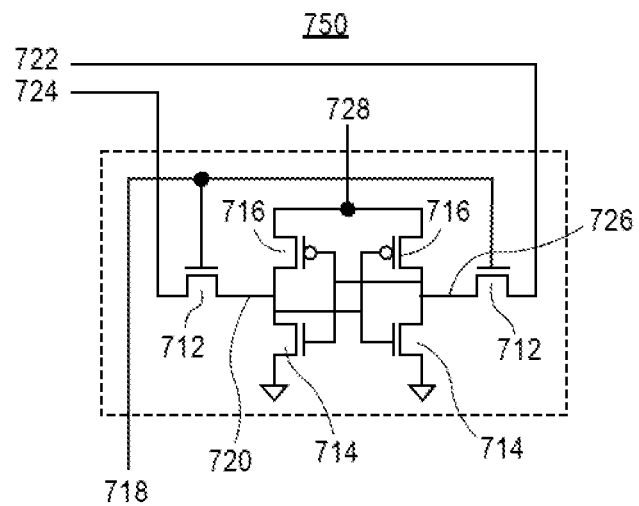

Referring to FIGS. 7A and 7B, a bit cell layout 702 includes therein gate lines 704 (which may also be referred to as poly lines) parallel along direction (2). Trench contact lines 706 alternate with the gate lines 704. The gate lines 704 and trench contact lines 706 are over NMOS diffusion regions 708 (e.g., P-type doped active regions, such as boron doped diffusion regions of an underlying substrate) and PMOS diffusion regions 710 (e.g., N-type doped active regions, such as phosphorous and/or arsenic doped diffusion regions of an underlying substrate) which are parallel along direction (1). In an embodiment, both of the NMOS diffusion regions 708 each includes two silicon fins. Both of the PMOS diffusion regions 710 each includes one silicon fin.

Referring again to FIGS. 7A and 7B, NMOS pass gate transistors 712, NMOS pull-down transistors 714, and PMOS pull-up transistors 716 are formed from the gate lines 704 and the NMOS diffusion regions 708 and the PMOS diffusion regions 710. Also depicted are a wordline (WL) 718, internal nodes 720 and 726, a bit line (BL) 722, a bit line bar (BLB) 724, SRAM VCC 728, and VSS 730.

In an embodiment, contact to the first and second gate lines 704 of the bit cell layout 702 is made to active gate locations of the first and second gate lines 704. In an embodiment, the 6T SRAM bit cell 704 includes an internal node jumper, such as described above.

In an embodiment, layouts described herein are compatible with uniform plug and mask patterns, including a uniform fin trim mask. Layouts may be compatible with non-EUV processes. Additionally, layouts may only require use of a middle-fin trim mask. Embodiments described herein may enable increased density in terms of area compared to conventional layouts. Embodiments may be implemented to provide a layout-efficient memory implementation in advanced self-aligned process technologies. Advantages may be realized in terms of die area and/or memory performance. Circuit techniques may be uniquely enabled by such layout approaches.

Figure 8A:
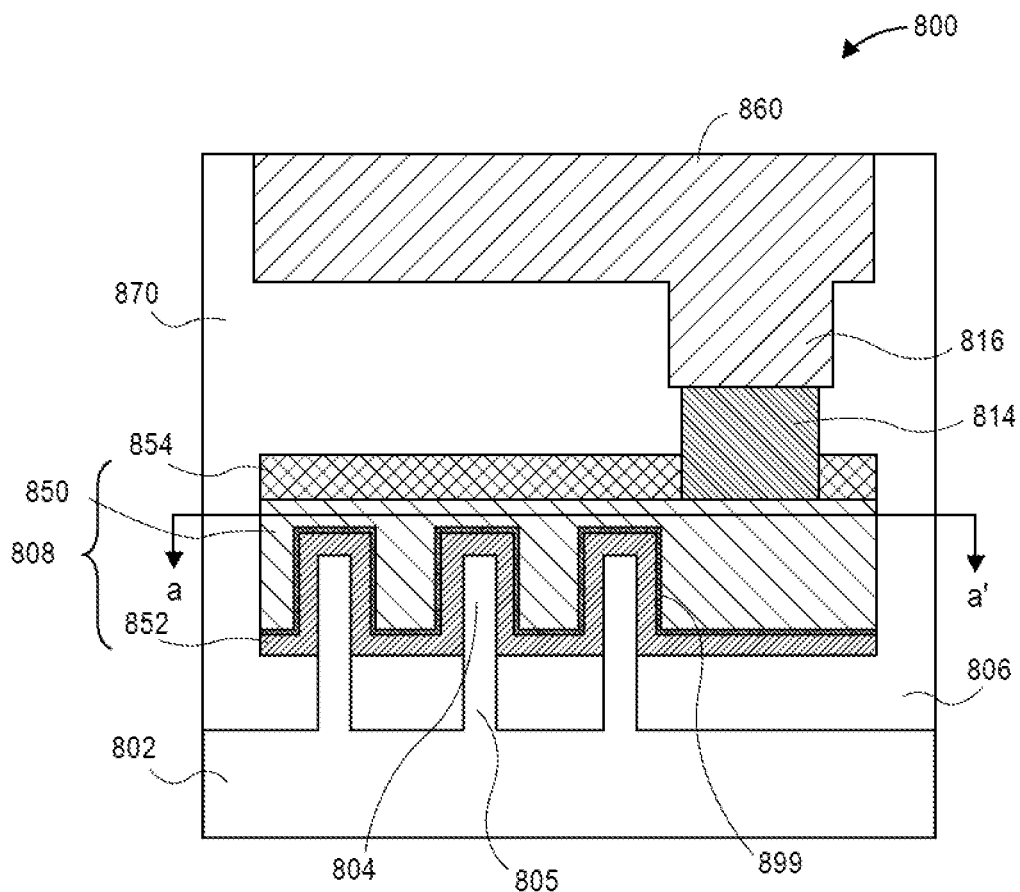
FIG. 8A illustrates a cross-sectional view of a non-planar semiconductor device, in accordance with an embodiment of the present disclosure.
Figure 8B:
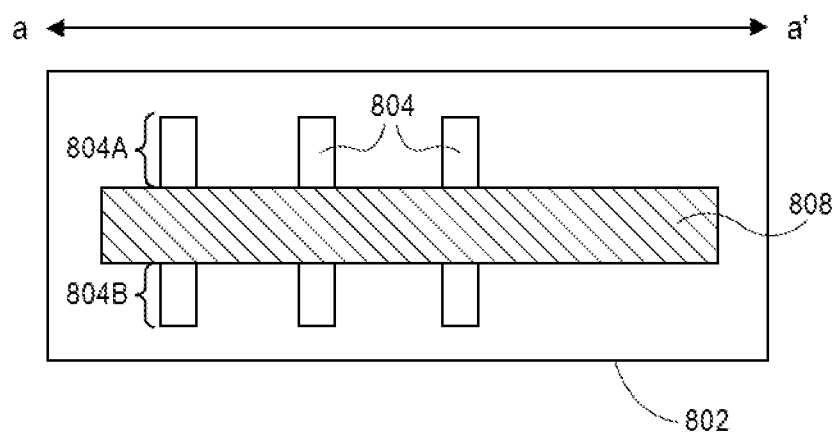
FIG. 8B illustrates a plan view taken along the a-a' axis of the semiconductor device of FIG. 8A, in accordance with an embodiment of the present disclosure.

One or more embodiments described herein are directed to the integration of semiconductor devices, such as metal oxide semiconductor (MOS) device integration. As an example, FIG. 8A illustrates a cross-sectional view of a non-planar semiconductor device, in accordance with an embodiment of the present disclosure. FIG. 8B illustrates a plan view taken along the a-a' axis of the semiconductor device of FIG. 8A, in accordance with an embodiment of the present disclosure.

Referring to FIG. 8A, a semiconductor structure or device 800 includes a non-planar active region (e.g., a fin structure including protruding fin portion 804 and sub-fin region 805) formed from substrate 802, and within isolation region 806. A gate line 808 is disposed over the protruding portions 804 of the non-planar active region as well as over a portion of the isolation region 806. As shown, gate line 808 includes a gate electrode 850/899 and a gate dielectric layer 852. In one embodiment, gate line 808 may also include a dielectric cap layer 854. A gate contact 814, and overlying gate contact via 816 are also seen from this perspective, along with an overlying metal interconnect 860, all of which are disposed in inter-layer dielectric stacks or layers 870.

Also seen from the perspective of FIG. 8A, the gate contact 814 is, in one embodiment, disposed over isolation region 806, but not over the non-planar active regions. However, the arrangement of semiconductor structure or device 800 places the gate contact over isolation regions. Such an arrangement may, for certain technology nodes be viewed as inefficient use of layout space in certain applications or may be limiting for cell design. In another embodiment, a semiconductor device has contact structures that contact portions of a gate electrode formed over an active region to provide a contact-over-active-gate (COAG) architecture.

It is to be appreciated that, for convenience of illustration, the gate line 808 is shown over three protruding fin portions 804, but is not limited as such. For example, a gate line can instead be formed over 1, 2, 4 or even more protruding fin portions. As is applicable throughout the present disclosure, the protruding fin portions 804 may be referred to as forming a grating structure. In an embodiment, the term "grating" for protruding fin portions 804 is used herein to refer to a tight pitch grating structure. In one such embodiment, the tight pitch is not achievable directly through conventional lithography. For example, a pattern based on conventional lithography may first be formed, but the pitch may be halved by the use of spacer mask patterning, as is known in the art. Even further, the original pitch may be quartered by a second round of spacer mask patterning. Accordingly, the grating-like patterns described herein may have protruding fin portions 804 spaced at a constant pitch and having a constant width. The pattern may be fabricated by a pitch halving or pitch quartering, or other pitch division, approach.

Referring to FIG. 8B, the gate line 808 is shown as disposed over the protruding fin portions 804. Source and drain regions 804A and 804B of the protruding fin portions 804 can be seen from this perspective. In one embodiment, the source and drain regions 804A and 804B are doped portions of original material of the protruding fin portions 804. In another embodiment, the material of the protruding fin portions 804 is removed and replaced with another semiconductor material, e.g., by epitaxial deposition. In either case, the source and drain regions 804A and 804B may extend below the height of dielectric layer 806, i.e., into the sub-fin region 805.

In an embodiment, the semiconductor structure or device 800 is a non-planar device such as, but not limited to, a fin-FET or a tri-gate device. In such an embodiment, a corresponding semiconducting channel region is composed of or is formed in a three-dimensional body. In one such embodiment, the gate electrode and gate electrode materials of gate lines 808 surround at least a top surface and a pair of sidewalls of the three-dimensional body.

Substrate 802 may be composed of a semiconductor material that can withstand a manufacturing process and in which charge can migrate. In an embodiment, substrate 802 is a bulk substrate composed of a crystalline silicon, silicon/germanium or germanium layer doped with a charge carrier, such as but not limited to phosphorus, arsenic, antimony, boron, gallium or a combination thereof, to form active region 804. In one embodiment, the concentration of silicon atoms in bulk substrate 802 is greater than 97%. In another embodiment, bulk substrate 802 is composed of an epitaxial layer grown atop a distinct crystalline substrate, e.g. a silicon epitaxial layer grown atop a boron-doped bulk silicon mono-crystalline substrate. Bulk substrate 802 may alternatively be composed of a group III-V material. In an embodiment, bulk substrate 802 is composed of a III-V material such as, but not limited to, gallium nitride, gallium phosphide, gallium arsenide, indium phosphide, indium antimonide, indium gallium arsenide, aluminum gallium arsenide, indium gallium phosphide, or a combination thereof. In one embodiment, bulk substrate 802 is composed of a III-V material and the charge-carrier dopant impurity atoms are ones such as, but not limited to, magnesium, beryllium, zinc, carbon, silicon, germanium, oxygen, sulfur, selenium or tellurium.

Isolation region 806 may be composed of a material suitable to ultimately electrically isolate, or contribute to the isolation of, portions of a permanent gate structure from an underlying bulk substrate or isolate active regions formed within an underlying bulk substrate, such as isolating fin active regions. For example, in one embodiment, the isolation region 806 is composed of a dielectric material such as, but not limited to, silicon dioxide, silicon oxy-nitride, silicon nitride, or carbon-doped silicon nitride.

In an embodiment, the gate dielectric layer 852 is composed of a high-K material. For example, in one embodiment, the gate dielectric layer 852 is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Furthermore, a portion of gate dielectric layer may include a layer of native oxide formed from the top few layers of the substrate 802. In an embodiment, the gate dielectric layer is composed of a top high-k portion and a lower portion composed of an oxide of a semiconductor material. In one embodiment, the gate dielectric layer 852 is composed of a top portion of hafnium oxide and a bottom portion of silicon dioxide or silicon oxy-nitride.

In an embodiment, layer 850 of the gate electrode 850/899 is composed of a non-workfunction-setting conductive fill material formed above a workfunction-setting layer 899. In a particular embodiment, the transistor 800 is an N-type (NMOS) transistor, and the workfunction-setting layer 899 is an N-type workfunction. In another particular embodiment, the transistor 800 is a P-type (PMOS) transistor, and the workfunction-setting layer 899 has a P-type workfunction.

In one such embodiment, the conductive fill material 850 includes a material such as but not limited to, tungsten (W), aluminum (Al), or copper (Cu). In one embodiment, one or more conductive barrier layers (such as titanium nitride or tantalum nitride) is between layers 850 and 899 of the gate electrode. In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

In an embodiment, the dielectric cap layer 854 and/or dielectric spacers associated with the gate electrode stacks may be composed of a material suitable to ultimately electrically isolate, or contribute to the isolation of, a permanent gate structure from adjacent or overlying conductive contacts, such as self-aligned contacts. For example, in one embodiment, the dielectric cap layer 854 and/or dielectric spacers are composed of a dielectric material such as, but not limited to, silicon dioxide, silicon oxy-nitride, silicon nitride, or carbon-doped silicon nitride.

Gate contact 814, overlying gate contact via 816, and/or overlying metal interconnect 860 may be composed of a conductive material. In an embodiment, one or more of the contacts, interconnects or vias are composed of a metal species. The metal species may be a pure metal, such as tungsten, nickel, or cobalt, or may be an alloy such as a metal-metal alloy or a metal-semiconductor alloy (e.g., such as a silicide material). In a particular embodiment, one or more of gate contact 814, overlying gate contact via 816, or overlying metal interconnect 860 includes a barrier layer and a conductive fill material. In one such embodiment, the barrier layer is composed of titanium and/or titanium nitride or tantalum and/or tantalum nitride. In another embodiment, the conductive fill material is composed of a conductive material such as, but not limited to, Cu, Al, Ti, Zr, Hf, V, Ru, Co, Ni, Pd, Pt, W, Ag, Au or alloys thereof. In general, as used throughout the present disclosure, interconnect lines are also sometimes referred to in the art as traces, wires, lines, metal lines, or simply interconnects.

In an embodiment, inter-layer dielectric stacks or layers 870 are composed of or includes a layer of a dielectric or insulating material. Examples of suitable dielectric materials include, but are not limited to, oxides of silicon (e.g., silicon dioxide ($SiO_2$)), doped oxides of silicon, fluorinated oxides of silicon, carbon doped oxides of silicon, various low-k dielectric materials known in the arts, and combinations thereof. The interlayer dielectric material may be formed by conventional techniques, such as, for example, chemical vapor deposition (CVD), physical vapor deposition (PVD), or by other deposition methods.

In an embodiment (although not shown), providing structure 800 involves formation of a contact pattern which is essentially perfectly aligned to an existing gate pattern while eliminating the use of a lithographic step with exceedingly tight registration budget. In one such embodiment, this approach enables the use of intrinsically highly selective wet etching (e.g., versus conventionally implemented dry or plasma etching) to generate contact openings. In an embodiment, a contact pattern is formed by utilizing an existing gate pattern in combination with a contact plug lithography operation. In one such embodiment, the approach enables elimination of the need for an otherwise critical lithography operation to generate a contact pattern, as used in conventional approaches. In an embodiment, a trench contact grid is not separately patterned, but is rather formed between poly (gate) lines. For example, in one such embodiment, a trench contact grid is formed subsequent to gate grating patterning but prior to gate grating cuts.

Furthermore, the gate stack structure 808 may be fabricated by a replacement gate process. In such a scheme, dummy gate material such as polysilicon or silicon nitride pillar material, may be removed and replaced with permanent gate electrode material. In one such embodiment, a permanent gate dielectric layer is also formed in this process, as opposed to being carried through from earlier processing. In an embodiment, dummy gates are removed by a dry etch or wet etch process. In one embodiment, dummy gates are composed of polycrystalline silicon or amorphous silicon and are removed with a dry etch process including use of $SF_6$. In another embodiment, dummy gates are composed of polycrystalline silicon or amorphous silicon and are removed with a wet etch process including use of aqueous $NH_4OH$ or tetramethylammonium hydroxide. In one embodiment, dummy gates are composed of silicon nitride and are removed with a wet etch including aqueous phosphoric acid.

In an embodiment, one or more approaches described herein contemplate essentially a dummy and replacement gate process in combination with a dummy and replacement contact process to arrive at structure 800. In one such embodiment, the replacement contact process is performed after the replacement gate process to allow high temperature anneal of at least a portion of the permanent gate stack. For example, in a specific such embodiment, an anneal of at least a portion of the permanent gate structures, e.g., after a gate dielectric layer is formed, is performed at a temperature greater than approximately 600 degrees Celsius. The anneal is performed prior to formation of the permanent contacts.

In an embodiment, prior to (e.g., in addition to) forming a gate contact structure (such as a via) over an active portion of a gate and in a same layer as a trench contact via, one or more embodiments of the present disclosure include first using a gate aligned trench contact process. Such a process may be implemented to form trench contact structures for semiconductor structure fabrication, e.g., for integrated circuit fabrication. In an embodiment, a trench contact pattern is formed as aligned to an existing gate pattern. By contrast, conventional approaches typically involve an additional lithography process with tight registration of a lithographic contact pattern to an existing gate pattern in combination with selective contact etches. For example, a conventional process may include patterning of a poly (gate) grid with separate patterning of contact features.

In a particular embodiment, each of the trench contacts includes a barrier layer and a conductive fill material. In one such embodiment, the barrier layer is composed of titanium and/or titanium nitride or tantalum and/or tantalum nitride. In an embodiment, the conductive fill material is composed of a conductive material such as, but not limited to, Cu, Al, Ti, Zr, Hf, V, Ru, Co, Ni, Pd, Pt, W, Ag, Au or alloys thereof.

It is to be appreciated that not all aspects of the processes described above need be practiced to fall within the spirit and scope of embodiments of the present disclosure. For example, in one embodiment, dummy gates need not ever be formed prior to fabricating gate contacts over active portions of the gate stacks. The gate stacks described above may actually be permanent gate stacks as initially formed. Also, the processes described herein may be used to fabricate one or a plurality of semiconductor devices. The semiconductor devices may be transistors or like devices. For example, in an embodiment, the semiconductor devices are a metal-oxide semiconductor (MOS) transistors for logic or memory, or are bipolar transistors. Also, in an embodiment, the semiconductor devices have a three-dimensional architecture, such as a trigate device, an independently accessed double gate device, or a FIN-FET. One or more embodiments may be particularly useful for fabricating semiconductor devices at a 10 nanometer (10 nm) or smaller technology node.

In an embodiment, as is also used throughout the present description, lithographic operations are performed using 193 nm immersion lithography (i193), extreme ultra-violet (EUV) and/or electron beam direct write (EBDW) lithography, or the like. A positive tone or a negative tone resist may be used. In one embodiment, a lithographic mask is a trilayer mask composed of a topographic masking portion, an anti-reflective coating (ARC) layer, and a photoresist layer. In a particular such embodiment, the topographic masking portion is a carbon hardmask (CHM) layer and the anti-reflective coating layer is a silicon ARC layer.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 9:
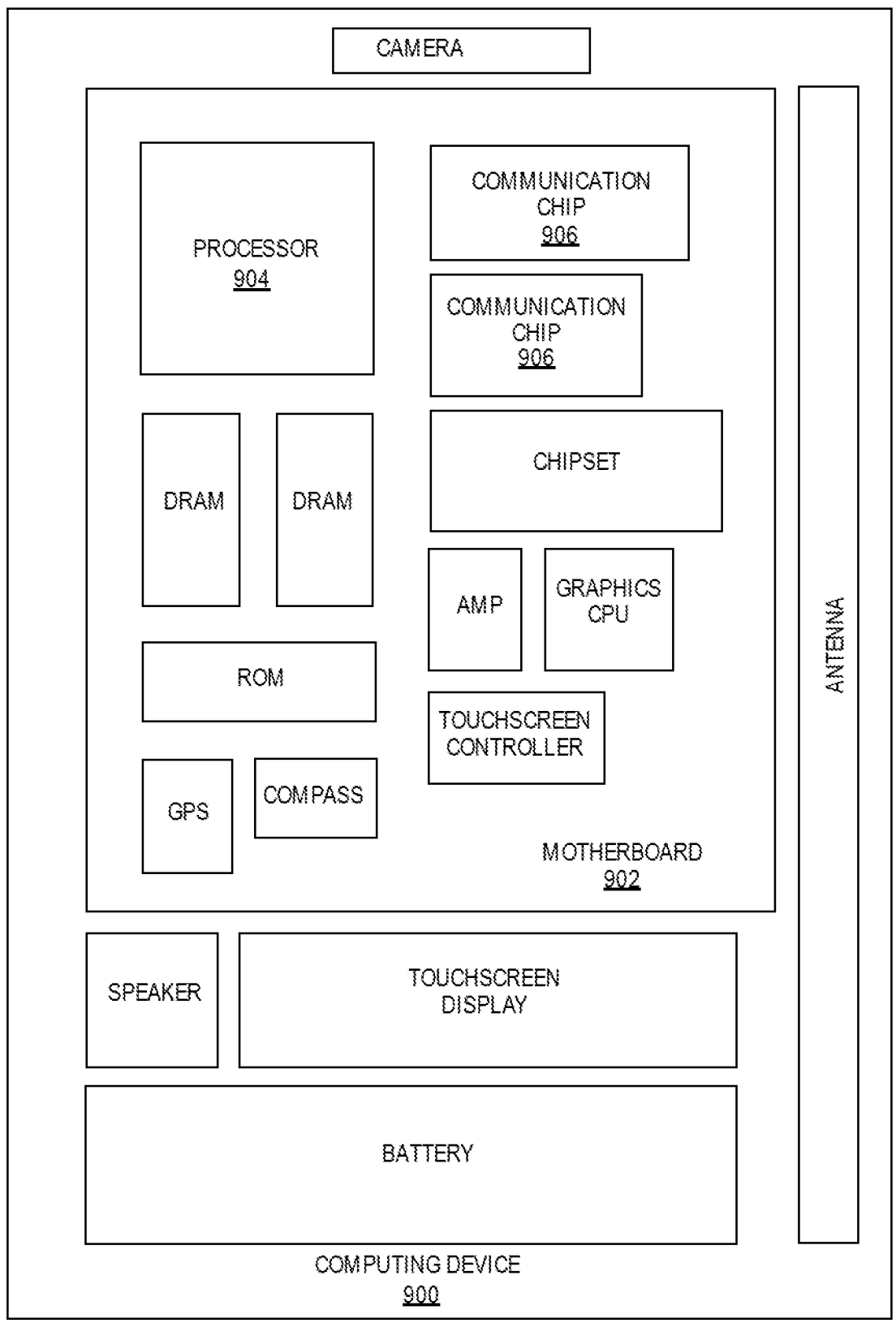
FIG. 9 illustrates a computing device in accordance with one implementation of an embodiment of the disclosure.

FIG. 9 illustrates a computing device 900 in accordance with one implementation of the disclosure. The computing device 900 houses a board 902. The board 902 may include a number of components, including but not limited to a processor 904 and at least one communication chip 906. The processor 904 is physically and electrically coupled to the board 902. In some implementations the at least one communication chip 906 is also physically and electrically coupled to the board 902. In further implementations, the communication chip 906 is part of the processor 904.

Depending on its applications, computing device 900 may include other components that may or may not be physically and electrically coupled to the board 902. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 906 enables wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 906 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 900 may include a plurality of communication chips 906. For instance, a first communication chip 906 may be dedicated to shorter range wireless communications such as Wi-Fi and Bluetooth and a second communication chip 906 may be dedicated to longer range wireless communications such as GPS, EDGE, GPRS, CDMA, WiMAX, LTE, Ev-DO, and others.

The processor 904 of the computing device 900 includes an integrated circuit die packaged within the processor 904. In some implementations of the disclosure, the integrated circuit die of the processor includes a memory bit cell layout having an internal node jumper, e.g., as provided by a metal line pattern having a tighter pitch than an underlying gate line pattern, in accordance with implementations of embodiments of the disclosure. The term "processor" may refer to any device or portion of a device that processes electronic data from registers and/or memory to transform that electronic data into other electronic data that may be stored in registers and/or memory.

The communication chip 906 also includes an integrated circuit die packaged within the communication chip 906. In accordance with another implementation of embodiments of the disclosure, the integrated circuit die of the communication chip includes a memory bit cell layout having an internal node jumper, e.g., as provided by a metal line pattern having a tighter pitch than an underlying gate line pattern, in accordance with implementations of embodiments of the disclosure.

In further implementations, another component housed within the computing device 900 may contain an integrated circuit die that includes a memory bit cell layout having an internal node jumper, e.g., as provided by a metal line pattern having a tighter pitch than an underlying gate line pattern, in accordance with implementations of embodiments of the disclosure.

In various implementations, the computing device 900 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 900 may be any other electronic device that processes data.

Figure 10:
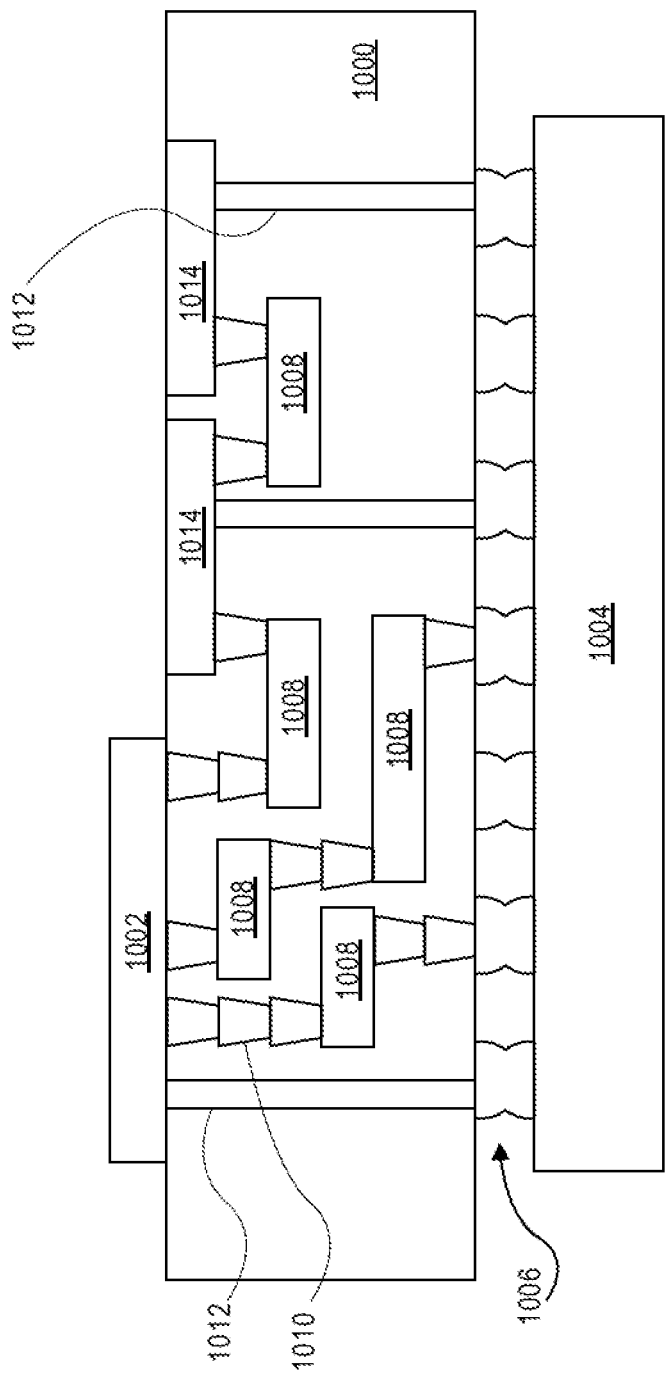
FIG. 10 is an interposer implementing one or more embodiments of the disclosure.

FIG. 10 illustrates an interposer 1000 that includes one or more embodiments of the disclosure. The interposer 1000 is an intervening substrate used to bridge a first substrate 1002 to a second substrate 1004. The first substrate 1002 may be, for instance, an integrated circuit die. The second substrate 1004 may be, for instance, a memory module, a computer motherboard, or another integrated circuit die. Generally, the purpose of an interposer 1000 is to spread a connection to a wider pitch or to reroute a connection to a different connection. For example, an interposer 1000 may couple an integrated circuit die to a ball grid array (BGA) 1006 that can subsequently be coupled to the second substrate 1004. In some embodiments, the first and second substrates 1002/1004 are attached to opposing sides of the interposer 1000. In other embodiments, the first and second substrates 1002/1004 are attached to the same side of the interposer 1000. And in further embodiments, three or more substrates are interconnected by way of the interposer 1000.

The interposer 1000 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 1008 and vias 1010, including but not limited to through-silicon vias (TSVs) 1012. The interposer 1000 may further include embedded devices 1014, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 1000. In accordance with embodiments of the disclosure, apparatuses or processes disclosed herein may be used in the fabrication of interposer 1000. In one such embodiment, one or more of the components of the interposer 1000 include a memory bit cell layout having an internal node jumper, e.g., as provided by a metal line pattern having a tighter pitch than an underlying gate line pattern.

Thus, embodiments described herein include memory bit cells having internal node jumpers.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example embodiment 1: An integrated circuit structure includes a memory bit cell on a substrate. The memory bit cell includes first, second, third and fourth active regions parallel along a first direction of the substrate. First and second gate lines are over the first, second, third and fourth active regions, the first and second gate lines parallel along a second direction of the substrate, the second direction perpendicular to the first direction. First, second and third interconnect lines are over the first and second gate lines, the first, second and third interconnect lines parallel along the second direction of the substrate. The first and second interconnect lines are electrically connected to the first and second gate lines at locations of the first and second gate lines over one or more of the first, second, third and fourth active regions. The third interconnect line electrically couples together a pair of gate electrodes of the memory bit cell or electrically couples together a pair of trench contacts of the memory bit cell.

Example embodiment 2: The integrated circuit structure of example embodiment 1, wherein the third interconnect line electrically couples together the pair of gate electrodes of the memory bit cell.

Example embodiment 3: The integrated circuit structure of example embodiment 1, wherein the third interconnect line electrically couples together the pair of trench contacts of the memory bit cell.

Example embodiment 4: The integrated circuit structure of example embodiment 1, 2 or 3, wherein the first active region is a P-type doped active region, the second active region is an N-type doped active region, the third active region is an N-type doped active region, and the fourth active region is an N-type doped active region.

Example embodiment 5: The integrated circuit structure of example embodiment 1, 2, 3 or 4, wherein the first, second, third and fourth active regions are in silicon fins.

Example embodiment 6: The integrated circuit structure of example embodiment 1, 2, 3, 4 or 5, wherein the memory bit cell includes a pull-up transistor based on a single silicon fin, a pass-gate transistor based on two silicon fins, and a pull-down transistor based on two silicon fins.

Example embodiment 7: The integrated circuit structure of example embodiment 1, 2, 3, 4, 5 or 6, wherein the first and second gate lines alternate with individual ones of a plurality of trench contact lines parallel along the second direction of the substrate, the plurality of trench contact lines including the pair of trench contacts of the memory bit cell.

Example embodiment 8: The integrated circuit structure of example embodiment 1, 2, 3, 4, 5, 6 or 7, wherein the first and second gate lines have a first pitch along the first direction, the first, second and third interconnect lines have a second pitch along the first direction, and wherein the second pitch is less than the first pitch.

Example embodiment 9: The integrated circuit structure of example embodiment 1, 2, 3, 4, 5, 6, 7 or 8, wherein the first pitch is in the range of 50 nanometers to 60 nanometers, and wherein the second pitch is in the range of 30 nanometers to 40 nanometers.

Example embodiment 10: The integrated circuit structure of example embodiment 1, 2, 3, 4, 5, 6, 7, 8 or 9, wherein the first and second interconnect lines are electrically connected to the first and second gate lines by an intervening plurality of interconnect lines between the first and second interconnect lines and the first and second gate lines, and wherein the intervening plurality of interconnect lines is parallel along the first direction of the substrate.

Example embodiment 11: An integrated circuit structure includes a memory bit cell on a substrate. The memory bit cell includes first and second gate lines parallel along a second direction of the substrate. The first and second gate lines have a first pitch along a first direction of the substrate, the first direction perpendicular to the second direction. First, second and third interconnect lines are over the first and second gate lines. The first, second and third interconnect lines are parallel along the second direction of the substrate. The first, second and third interconnect lines have a second pitch along the first direction, where the second pitch is less than the first pitch. One of the first, second and third interconnect lines is an internal node jumper for the memory bit cell.

Example embodiment 12: The integrated circuit structure of example embodiment 11, wherein the internal node jumper electrically couples together a pair of gate electrodes of the memory bit cell.

Example embodiment 13: The integrated circuit structure of example embodiment 11, wherein the internal node jumper electrically couples together a pair of trench contacts of the memory bit cell.

Example embodiment 14: The integrated circuit structure of example embodiment 11, 12 or 13, wherein the first and second gate lines alternate with individual ones of a plurality of trench contact lines parallel along the second direction of the substrate.

Example embodiment 15: The integrated circuit structure of example embodiment 11, 12, 13 or 14, wherein the first pitch is in the range of 50 nanometers to 60 nanometers, and wherein the second pitch is in the range of 30 nanometers to 40 nanometers.

Example embodiment 16: An integrated circuit structure includes a substrate. A six transistor (6T) static random access memory (SRAM) bit cell is on the substrate. The 6T SRAM bit cell includes first, second, third and fourth active regions parallel along a first direction of the substrate. The first active region includes two silicon fins, the second active region includes one silicon fin, the third active region includes one silicon fin, and the fourth active region includes two silicon fins. First and second gate lines are over the first and second active regions. The first and second gate lines are parallel along a second direction of the substrate, the second direction perpendicular to the first direction.

Example embodiment 17: The integrated circuit structure of example embodiment 16, wherein the first and fourth active regions are P-type doped active regions, and the second and third active regions are N-type doped active regions.

Example embodiment 18: The integrated circuit structure of example embodiment 16 or 17, wherein individual ones of the first and second gate lines are spaced apart from one another by trench contact lines parallel along the second direction of the substrate.

Example embodiment 19: The integrated circuit structure of example embodiment 16, 17 or 18, wherein contact to the first and second gate lines is made to active gate locations of the first and second gate lines.

Example embodiment 20: The integrated circuit structure of example embodiment 16, 17, 18 or 19, wherein 6T SRAM bit cell includes an internal node jumper.

What is claimed is:

1. An integrated circuit structure, comprising:
    a memory bit cell, comprising:
        first, second, third and fourth three-dimensional semiconductor bodies parallel along a first direction;
        first and second gate lines over the first, second, third and fourth three-dimensional semiconductor bodies, the first and second gate lines each surrounding one or more of the first, second, third and fourth three-dimensional semiconductor bodies, and the first and second gate lines parallel along a second direction, the second direction perpendicular to the first direction; and
        first, second and third interconnect lines over the first and second gate lines, the first, second and third interconnect lines parallel along the second direction, wherein the first and second interconnect lines are electrically connected to the first and second gate lines at locations of the first and second gate lines over one or more of the first, second, third and fourth three-dimensional semiconductor bodies, wherein the third interconnect line electrically couples together a pair of gate electrodes of the memory bit cell or electrically couples together a pair of trench contacts of the memory bit cell, and wherein one of the first, second or third interconnect lines is vertically overlapping with one of the first or second gate lines.

2. The integrated circuit structure of claim 1, wherein the third interconnect line electrically couples together the pair of gate electrodes of the memory bit cell.

3. The integrated circuit structure of claim 1, wherein the third interconnect line electrically couples together the pair of trench contacts of the memory bit cell.

4. The integrated circuit structure of claim 1, wherein the first three-dimensional semiconductor body is a P-type doped three-dimensional semiconductor body, the second three-dimensional semiconductor body is an N-type doped three-dimensional semiconductor body, the third three-dimensional semiconductor body is an N-type doped three-dimensional semiconductor body, and the fourth three-dimensional semiconductor body is an N-type doped three-dimensional semiconductor body.

5. The integrated circuit structure of claim 1, wherein the first and second gate lines alternate with individual ones of a plurality of trench contact lines parallel along the second direction, the plurality of trench contact lines comprising the pair of trench contacts of the memory bit cell.

6. The integrated circuit structure of claim 1, wherein the first and second gate lines have a first pitch along the first direction, the first, second and third interconnect lines have a second pitch along the first direction, and wherein the second pitch is less than the first pitch.

7. The integrated circuit structure of claim 1, wherein the first pitch is in the range of 50 nanometers to 60 nanometers, and wherein the second pitch is in the range of 30 nanometers to 40 nanometers.

8. The integrated circuit structure of claim 1, wherein the first and second interconnect lines are electrically connected to the first and second gate lines by an intervening plurality of interconnect lines between the first and second interconnect lines and the first and second gate lines, and wherein the intervening plurality of interconnect lines is parallel along the first direction.

9. An integrated circuit structure, comprising:
a three-dimensional body comprising silicon;
a first gate electrode and a second gate electrode over the three-dimensional body, the first gate electrode and the second gate electrode surrounding the three-dimensional body, the first and second gate electrodes along a first direction, and the first and second gate electrodes having a first pitch;
a first plurality of metal lines above the first and second gate electrodes;
a gate contact coupling one of the first plurality of metal lines to the first gate electrode at a location vertically over the three-dimensional body;
a second plurality of metal lines over the first plurality of metal lines, wherein metal lines of the second plurality of metal lines are along the first direction and have a second pitch, the second pitch less than the first pitch, and wherein one of the second plurality of metal lines is vertically overlapping with one of the first or second gate electrodes.

10. The integrated circuit structure of claim 9, wherein the second pitch is approximately 0.67 times the first pitch.

11. A computing device, comprising:
a board; and
a component coupled to the board, the component including an integrated circuit structure, comprising:
a memory bit cell, comprising:
first, second, third and fourth three-dimensional semiconductor bodies parallel along a first direction;
first and second gate lines over the first, second, third and fourth three-dimensional semiconductor bodies, the first and second gate lines each surrounding one or more of the first, second, third and fourth three-dimensional semiconductor bodies, and the first and second gate lines parallel along a second direction, the second direction perpendicular to the first direction; and
first, second and third interconnect lines over the first and second gate lines, the first, second and third interconnect lines parallel along the second direction, wherein the first and second interconnect lines are electrically connected to the first and second gate lines at locations of the first and second gate lines over one or more of the first, second, third and fourth three-dimensional semiconductor bodies, wherein the third interconnect line electrically couples together a pair of gate electrodes of the memory bit cell or electrically couples together a pair of trench contacts of the memory bit cell, and wherein one of the first, second or third interconnect lines is vertically overlapping with one of the first or second gate lines.

12. The computing device of claim 11, further comprising:
a memory coupled to the board.

13. The computing device of claim 11, further comprising:
a communication chip coupled to the board.

14. The computing device of claim 11, further comprising:
a battery coupled to the board.

15. The computing device of claim 11, further comprising:
a camera coupled to the board.

16. The computing device of claim 11, further comprising:
a compass coupled to the board.

17. The computing device of claim 11, further comprising:
a GPS coupled to the board.

18. The computing device of claim 11, further comprising:
a touchscreen display coupled to the board.

19. The computing device of claim 11, further comprising:
a speaker coupled to the board.

20. The computing device of claim 11, wherein the component is a packaged integrated circuit die.

* * * * *